United States Patent
Han et al.

(10) Patent No.: US 7,576,437 B2
(45) Date of Patent: Aug. 18, 2009

(54) PRINTED CIRCUIT BOARD OF SEMICONDUCTOR PACKAGE AND METHOD FOR MOUNTING SEMICONDUCTOR PACKAGE USING THE SAME

(75) Inventors: Seong-Chan Han, Cheonan-si (KR); Dong-Chun Lee, Cheonan-si (KR); Kwang-Su Yu, Cheonan-si (KR); Dong-Woo Shin, Cheonan-si (KR); Hyo-Jae Bang, Cheonan-si (KR); Hyun-Seok Choi, Cheonan-si (KR); Si-Suk Kim, Cheonan-si (KR)

(73) Assignee: Samsung Electronic Co., Ltd., Gyeonggi-do (KR)

( * ) Notice: Subject to any disclaimer, the term of this patent is extended or adjusted under 35 U.S.C. 154(b) by 151 days.

(21) Appl. No.: 11/598,755

(22) Filed: Nov. 14, 2006

(65) Prior Publication Data
US 2007/0109758 A1 May 17, 2007

(30) Foreign Application Priority Data
Nov. 14, 2005 (KR) .................. 10-2005-0108731

(51) Int. Cl.
*H01L 23/48* (2006.01)
*H01L 23/495* (2006.01)
(52) U.S. Cl. .............. 257/779; 257/773; 257/786; 257/696; 257/E23.031
(58) Field of Classification Search ......... 257/779, 257/773, 786, 690, 696, E23.031
See application file for complete search history.

(56) References Cited

U.S. PATENT DOCUMENTS

| | | | | |
|---|---|---|---|---|
| 4,572,925 A | * | 2/1986 | Scarlett ............ | 174/257 |
| 5,041,901 A | * | 8/1991 | Kitano et al. ...... | 257/779 |
| 5,095,407 A | * | 3/1992 | Kanezawa et al. ... | 361/794 |
| 5,311,405 A | * | 5/1994 | Tribbey et al. ..... | 361/767 |
| 2003/0052157 A1 | * | 3/2003 | Wunderlich et al. . | 228/254 |
| 2004/0150080 A1 | * | 8/2004 | Lee et al. ......... | 257/678 |

FOREIGN PATENT DOCUMENTS

| | | |
|---|---|---|
| JP | 11-204924 | 7/1999 |
| JP | 2000-252402 | 9/2000 |
| KR | 1020040041787 A | 5/2004 |

* cited by examiner

*Primary Examiner*—Nitin Parekh
(74) *Attorney, Agent, or Firm*—Harness, Dickey & Pierce, P.L.C.

(57) ABSTRACT

Example embodiments may be directed to a printed circuit board having an insulating substrate, pads disposed on the surface of the insulating substrate, a solder resist, and a solder moving portion. Leads of a semiconductor package may be mounted on the insulating substrate. The pads to which the leads of the semiconductor package are connected may be disposed on the surface of the insulating substrate. The solder resist layer may cover the insulating substrate, but may also contain openings exposing at least a portion of the pads to which the leads of the semiconductor package are connected. During the process by which each semiconductor lead is connected to a pad, the solder moving portion on the pad may allow an adhesion solder coating each of the leads of the semiconductor package to move towards a shoulder portion of the semiconductor package leads.

16 Claims, 6 Drawing Sheets

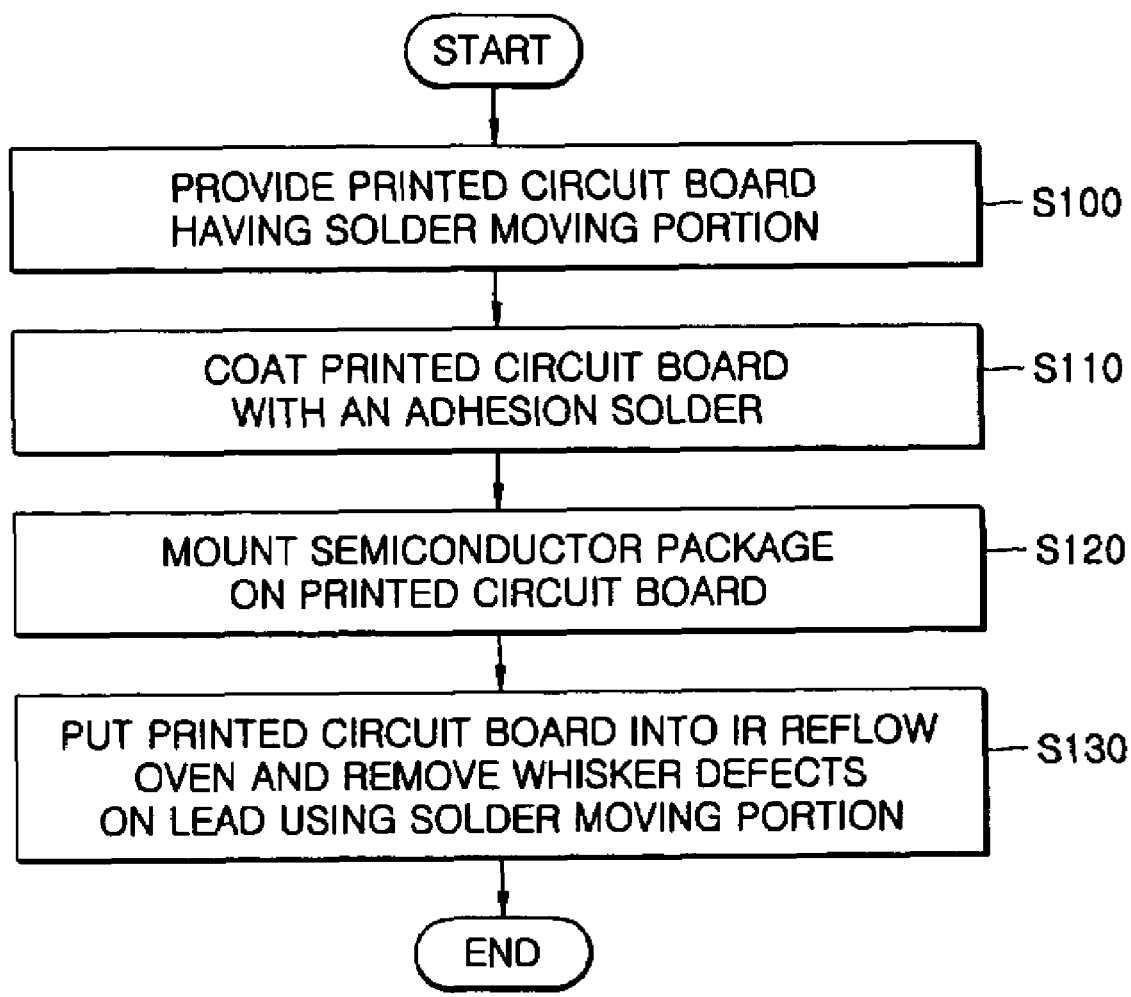

PRINTED CIRCUIT BOARD OF SEMICONDUCTOR PACKAGE AND METHOD FOR MOUNTING SEMICONDUCTOR PACKAGE USING THE SAME

PRIORITY STATEMENT

This application claims priority under 35 USC § 119 to Korean Patent Application No. 10-2005-0108731, filed on Nov. 14, 2005, in the Korean Intellectual Property Office (KIPO), the entire contents of which are incorporated herein by reference.

BACKGROUND

1. Field

Example embodiments relate to a printed circuit board on which a semiconductor package is mounted and a method for mounting a semiconductor package using the printed circuit board. Other example embodiments relate to a printed circuit board with a semiconductor package having leads as external connection terminals and a method for mounting a semiconductor package using the printed circuit board.

2. Description of the Related Art

In the semiconductor packaging field, there have been a number of changes in the semiconductor packaging process and the materials used to satisfy customers' demand for environmentally-friendly products. As a representative example, a lead (Pb) component has been removed from solder in many semiconductor packages. The removal of the lead component may have caused unexpected defects to occur in the assembly process of semiconductor packages. Semiconductor packages having leads for external connection terminals, for example, a small outline package (SOP), a thin small outline package (TSOP), a quad flat package (QFP) and/or a thin quad flat package (TQFP), may have shown an increase in the number of whisker defects on the leads.

FIG. 1 illustrates a section of a SOP 20. Gull wing leads 12 may be formed on a body 10 of an encapsulation resin (e.g., Epoxy Mold Compound). Whisker defects 14 may form on and beneath the surfaces of the leads 12, when the leads may be electrically coated with solder. Such whisker defects 14 may not be formed when the solder is made of a tin and lead alloy, as in the conventional art. The use of only tin in the solder, without the lead component, may increase the number of whisker defects. Copper may be a primary component of the leads and tin may be a primary component of the solder. The whisker defects 14 may occur due to a nonuniform interface between the copper leads and the tin layer. An external environment change (e.g., heat treatment inducing compression stress on the nonuniform copper and/or tin layer on the surfaces of the leads 12) may cause an abnormal growth of monocrystalline tin, which may result in a whisker defect.

In addition to nonuniform copper and/or tin layers, nonuniform organic materials may also cause whisker defects 14. It may be relatively difficult to remove the whisker defects because the whisker defects 14 may continue to form about 2,000 hours to about 4,000 hours after the semiconductor package is fabricated. The whisker defects 14 may pose a problem to semiconductor packaging process because the whisker defect may cause short-circuits with adjacent leads or between electronic parts mounted on the printed circuit board, when the semiconductor package is mounted on the printed circuit board.

SUMMARY

Example embodiments provide a printed circuit board (PCB) capable of removing whisker defects in a semiconductor package through a modified structure of pads of the printed circuit board that may be connected to leads of the semiconductor package. Example embodiments also provide a method for mounting a semiconductor package using, for example, a printed circuit board.

Example embodiments may be directed to a printed circuit board having an insulating substrate, pads disposed on the surface of the insulating substrate, a solder resist, and a solder moving portion. Leads of a semiconductor package may be mounted on the insulating substrate. The pads to which the leads of the semiconductor package may be connected may be disposed on the surface of the insulating substrate. The solder resist layer may cover the insulating substrate, but may also contain openings exposing at least a portion of the pads to which the leads of the semiconductor package may be connected. During the process by which each semiconductor lead is connected to a pad, the solder moving portion on the pad may allow an adhesion solder coating each of the leads of the semiconductor package to move towards a shoulder portion of the semiconductor package leads. The leads of the semiconductor package may include gull wing leads. The semiconductor package may be one of a small outline package, a thin, small outline package, a quad flat package and/or a thin, quad flat package.

In example embodiments, the pad may include a raised printed circuit pattern. In other example embodiments, the pad may include a sunken printed circuit pattern. The solder moving portion may include a first treated surface portion formed by treating one portion of the pad to which the semiconductor lead is connected with water-soluble oxidation inhibiting material. A second treated surface portion of the pad may be formed by surface treating the pad, to which the lead shoulder portion opposite to the end of the semiconductor package lead is connected, with a plating metal. The plating metal may include at least one of copper, nickel, and gold. Water-soluble oxidation inhibiting material on the first treated portion may be an organic salt durability preservative (OSP). The first treated surface portion may comprise a portion of the pad ranging from about 30% to about 70% of the total length of the pad.

In example embodiments, the solder moving portion may be a portion of the insulating substrate that is not covered by either the pad or the solder resist, and is adjacent to a portion of the pad to which the shoulder portion of the semiconductor package lead is connected. In example embodiments, the portion of the insulating substrate that is covered by neither the pad nor the solder resist may include about 10% to about 50% of the total length of the pad.

Example embodiments may be directed to a method for mounting a semiconductor package onto a printed circuit board. The method may include providing a printed circuit board, including an insulating substrate, pads and a solder resist, coating the pads of the printed circuit board with an adhesion solder, positioning the semiconductor package on the pad region of the printed circuit board that is coated with the adhesion solder, exposing the semiconductor package and the printed circuit board to an IR reflow process to adhere the semiconductor package to a portion of the printed circuit board, and removing whisker defects from the semiconductor package leads using the pads including a solder moving portion, the solder moving portion being capable of inducing the adhesion solder to flow to a shoulder portion of the semiconductor package lead.

In example embodiments, the adhesion solder may sufficiently flow along the shoulder portion of the semiconductor package lead through the modified surface treatment of the pads of the printed circuit board or the modified design of the pad region of the printed circuit board. It may be possible to dissolve and remove whisker defects on the shoulder portion of the semiconductor package lead when mounting the semiconductor package on the printed circuit board.

BRIEF DESCRIPTION OF THE DRAWINGS

Example embodiments will be more clearly understood from the following detailed description taken in conjunction with the accompanying drawings. FIGS. 1-12 represent non-limiting, example embodiments as described herein.

FIG. 1 is a diagram illustrating whisker defects occurring on leads of a conventional semiconductor package;

FIG. 2 is a diagram illustrating a printed circuit board (PCB) according to example embodiments;

FIG. 3 is a diagram illustrating a unit pad region of the printed circuit board of FIG. 2;

FIG. 4 is a diagram illustrating a section taken along an IV-IV' line of FIG. 3;

FIG. 5 is a diagram of a pad region illustrating a solder moving portion according to example embodiments;

FIG. 6 is a diagram illustrating a principle of removing whisker defects from a semiconductor package in a printed circuit board having a solder moving portion according to example embodiments;

FIG. 7 is a diagram illustrating a variant of example embodiments;

FIG. 8 is a diagram of a pad region illustrating a solder moving portion according to other example embodiments;

FIG. 9 is a diagram of the pad region illustrating a solder moving portion according to other example embodiments;

FIG. 10 is a diagram of a pad region illustrating a solder moving portion according to other example embodiments;

FIG. 11 is a diagram of the pad region illustrating a solder moving portion according to other example embodiments; and FIG. 12 is a flow chart illustrating example embodiments of a method for mounting a semiconductor package using a printed circuit board which is capable of removing whisker defects on a semiconductor package.

DETAILED DESCRIPTION OF EXAMPLE EMBODIMENTS

Figure 1:
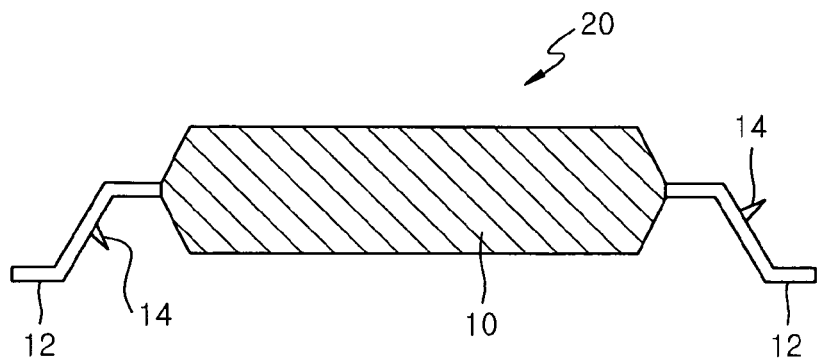

Example embodiments will now be described more fully hereinafter with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. Like numbers refer to like elements throughout the specification.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
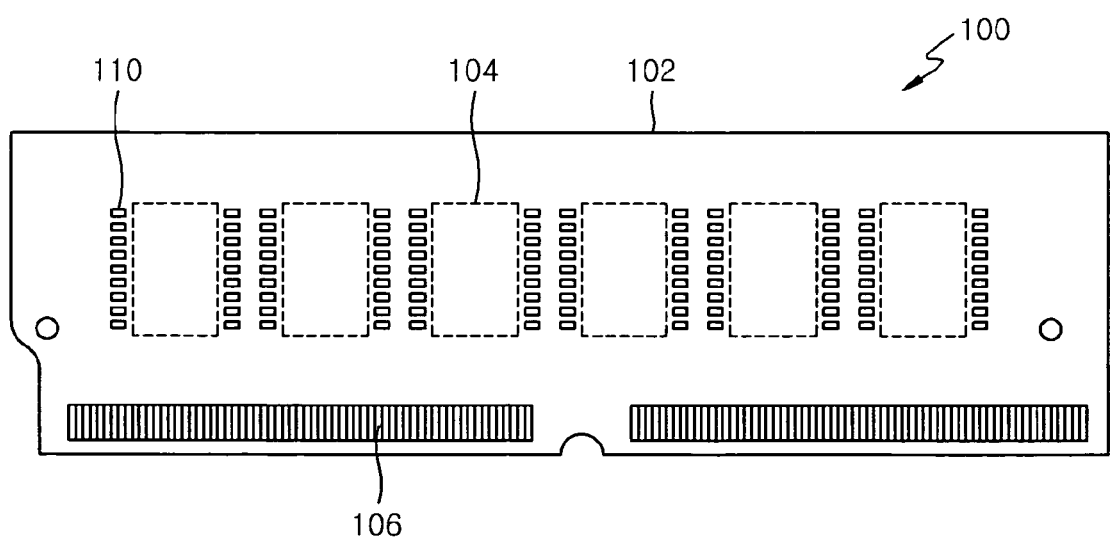

FIG. 2 is a diagram illustrating a printed circuit board (PCB) according to example embodiments. Referring to FIG. 2, a printed circuit board 100 for a module may include a board body 102 having regions 104 on which a semiconductor package is mounted, and pads 110 to which leads of the semiconductor package may be connected. In example embodiments, the pads may be in the form of a printed circuit pattern. The printed circuit pattern may be formed of copper. Connection terminals 106 may be made as printed circuit patterns at one side of the board body 102 for electrically connecting the printed circuit board 100 to a module of another printed circuit board (not shown).

Figure 4:
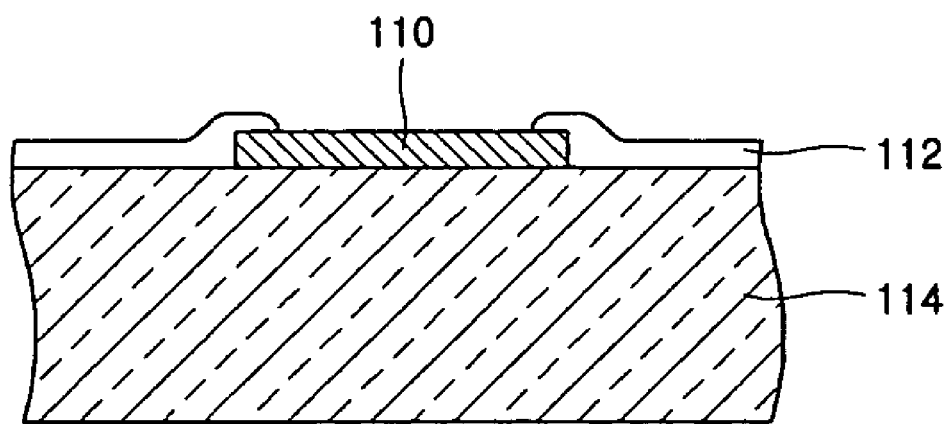
Figure 5:
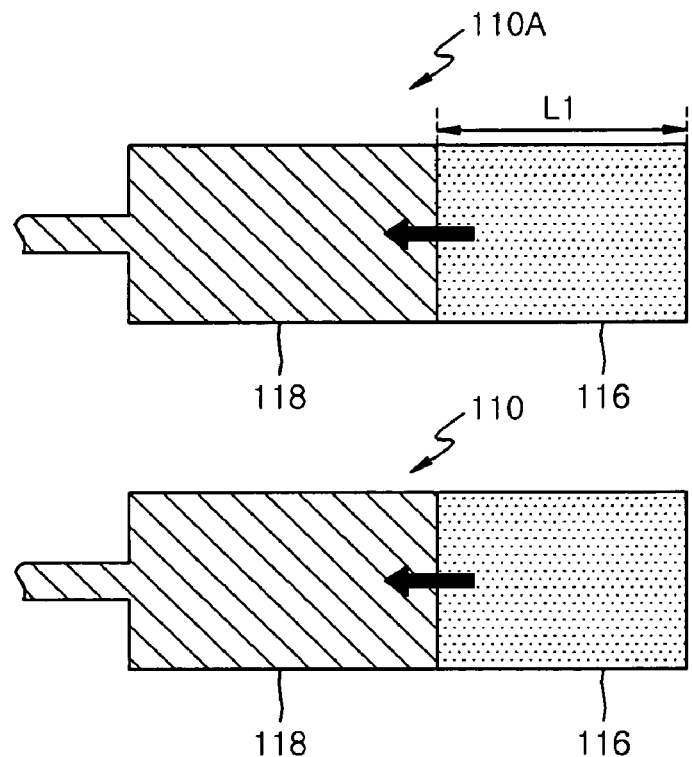

To remove whisker defects from the semiconductor package, the printed circuit board 100 may include an insulating substrate (114 of FIG. 4), the pads 110, a solder resist (112 of FIG. 4), and/or a solder moving portion L1 in FIG. 5. When the semiconductor package is mounted on the printed circuit board 100, the solder moving portion may cause the molten adhesion solder 16 coat on the surface of the pad 110 of the printed circuit board 100 to flow towards a shoulder portion of the semiconductor package lead. The flow of the molten adhesion solder 16 towards the solder moving portion L1 in FIG. 5 may dissolve and remove whisker defects which mainly occur at the lead shoulder region of the semiconductor package. This will be described in detail with reference to FIGS. 5 to 11.

The above-described top structure of the printed circuit board 100 is provided only to assist in understanding example embodiments. The printed circuit board 100 according to example embodiments is not limited to the printed circuit board for the module of FIG. 2 and may be applied to any circuit board on which semiconductor packages may be mounted. Those skilled in the art will appreciate that there may be many variations to the structure and material of the printed circuit board.

Figure 3:
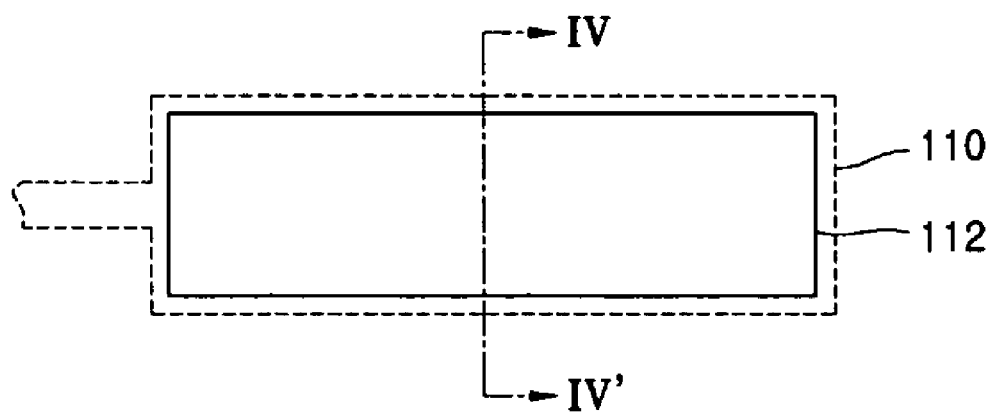

FIG. 3 is a diagram illustrating a unit pad region of the printed circuit board of FIG. 2, and FIG. 4 is a diagram illustrating a section taken along an IV-IV' line of FIG. 3. Referring to FIGS. 3 and 4, the pad 110 of the printed circuit board may be connected to the lead of the semiconductor package through an opening in the solder resist 112. A solder resist 112 may be an insulating material covering the surface of the printed circuit board. An insulating substrate 114 may be an insulating material, for example, FR4 resin, BT resin and/or polyimide. The pad 110 may have a printed circuit pattern formed of copper. The solder resist 112 formed around the pad 110 may have various shapes. While the solder resist 112 in FIGS. 3 and 4 is designed to surround an edge of the pad 110, it may be designed to be spaced from the pads 110 at a desired interval.

FIG. 5 is a diagram of a pad region illustrating a solder moving portion according to example embodiments. Referring to FIG. 5, the solder moving portion L1 according to example embodiments may be disposed in a unit pad 110A and may include a first treated surface portion 116 and a second treated surface portion 118. The first treated surface portion 116 may be a region formed by surface-treating the pad with organic solderability preservatives (OSP), for example, a water-soluble oxidization inhibiting material to reduce or prevent oxidization of the surface of the unit pad 110A, which may be made of a copper material. The second treated surface portion 118 may be formed by metal-plating the pad to reduce or prevent the oxidization of the surface of the unit pad 110A, which may be made of a copper material. The plating metal may be an alloy containing at least one of copper, nickel and/or gold (Au) and variations may be made to the metals by those skilled in the art.

An end of the lead of the semiconductor package may be connected to the first treated surface portion 116, and a shoulder portion of the lead of the semiconductor package may be connected to the second treated surface portion 118. The second treated surface portion 118 may have improved wettability to an adhesion solder 16 than the first treated surface portion 116. When the pad is coated with the adhesion solder l6, such a difference in the surface treatment on the unit pad 110A may allow the adhesion solder 16 to move from the first treated surface portion 116 to the second treated surface portion 118, as indicated by the arrow. The length of the first treated surface portion 116 may adjust to about 30% to about 70% of the total length of the pad 110A in order to adjust an amount of the adhesion solder 16 moving from the first treated surface portion 116 to the second treated surface portion 118.

Figure 6:
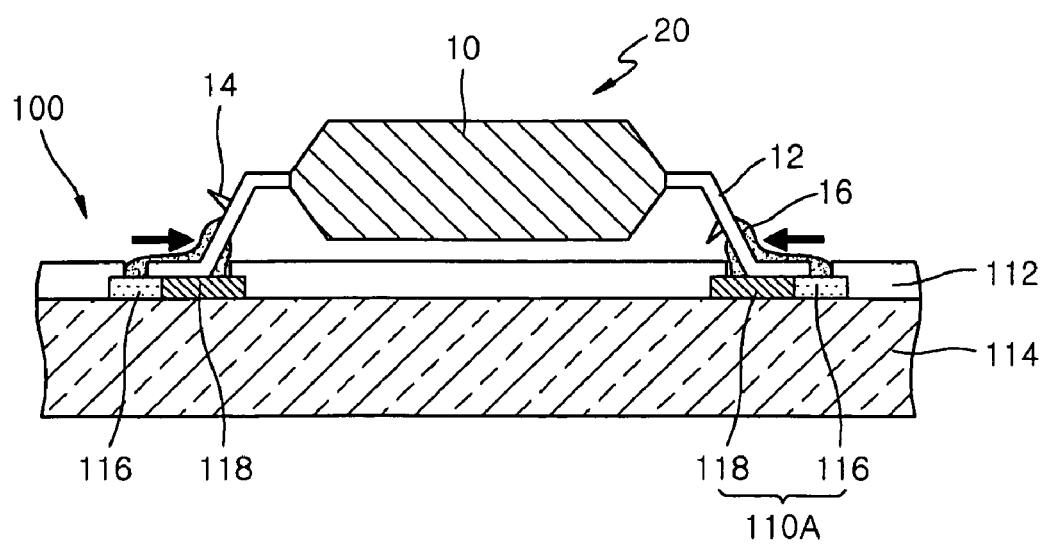

FIG. 6 is a diagram illustrating a principle of removing whisker defects from a semiconductor package in a printed circuit board having a solder moving portion according to example embodiments in FIG. 5. Referring to FIG. 6, a SOP 20 including a body 10 and leads 12 may be mounted on a printed circuit board 100 using an adhesion solder 16. The SOP 20 may also include a unit pad 110A having a solder 16 moving portion L1 according to the example embodiment of FIG. 5. The unit pad 110A may be embedded in the solder resist layer 112. The solder moving portion L1 may include first and second treated surface portions 116 and 118. The adhesion solder 16 coated on the surface of the unit pad 110A may move from the first treated surface portion 116 to the second treated surface portion 118, as illustrated in FIG. 5. The movement of the adhesion solder 16 may depend on a difference between the adhesion capabilities of the adhesion solder 16 to the first and second treated surface portions 116 and 118, the temperature of the adhesion solder, and on the surface tension of the adhesion solder 16 in a liquid state.

A relatively large amount of adhesion solder 16 may flow to the shoulder portion of the semiconductor package lead, compared to the lead end. During the IR reflow process, the adhesion solder 16 may flow on the shoulder portion of the semiconductor package lead 12, dissolving and removing abnormally grown whisker defects 14. Even though the whisker defect 14 may exist on the lead 12 of the semiconductor package, the whisker defects may be removed in a subsequent surface mounting process.

Figure 7:
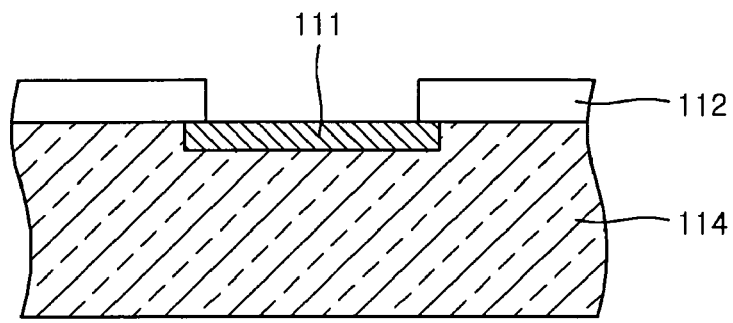

FIG. 7 is a diagram illustrating a variant of example embodiments. The unit pad 110A of the printed circuit board 100, shown in FIG. 6, may be located above the insulating substrate 114. Alternatively, the unit pad 110A may be sunk in the insulating substrate 114, as shown on the unit pad 111 of FIG. 7. First and second treated surface portions, 116 and 118 in FIG. 6, may be formed on the pad 111. The solder resist 112 may be formed on the insulating substrate 114.

Figure 8:
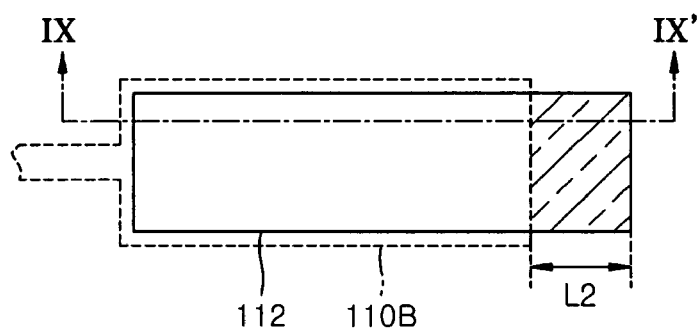
Figure 9:
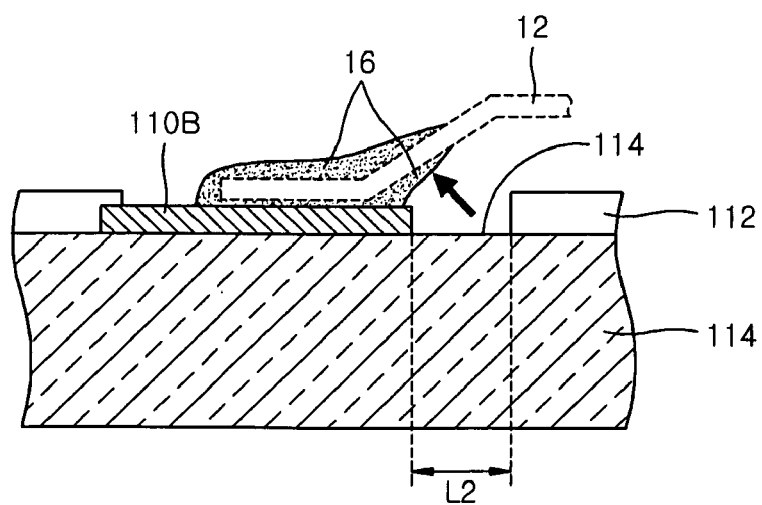

FIG. 8 is a diagram of a pad region illustrating a solder moving portion according to other example embodiments, and FIG. 9 is a diagram illustrating a section taken along a IX-IX' line of FIG. 8. Referring to FIGS. 8 and 9, a solder moving portion L2 according to other example embodiments may be an exposed insulating substrate surface (L2) that is adjacent to a portion of the pad 110B to which the shoulder portion of the semiconductor package lead may be connected and that may not be covered by either the pad 110B or the solder resist 112.

The length of the disposed solder moving portion L2 may be in a range from about 10% to about 50% of the total length of the pads 110B in order to adjust to an amount of the adhesion solder 16 cohering to the shoulder region of the semiconductor package lead 12. The pad 110B may be surface-treated in the same manner as the metal plating and/or OSP. Alternatively, the pad 110B may be surface-treated to have a first treated surface portion and a second treated surface portion, as in the above-described example embodiment of FIG. 5. When mounting the semiconductor package, the adhesion solder, may move from the solder moving portion L2 to the shoulder portion of the semiconductor package lead 12 due to the adhesion capability of the adhesion solder with an underlying surface and the surface tension, as indicated by the arrow in FIG. 9, thereby removing the whisker defects.

Figure 10:
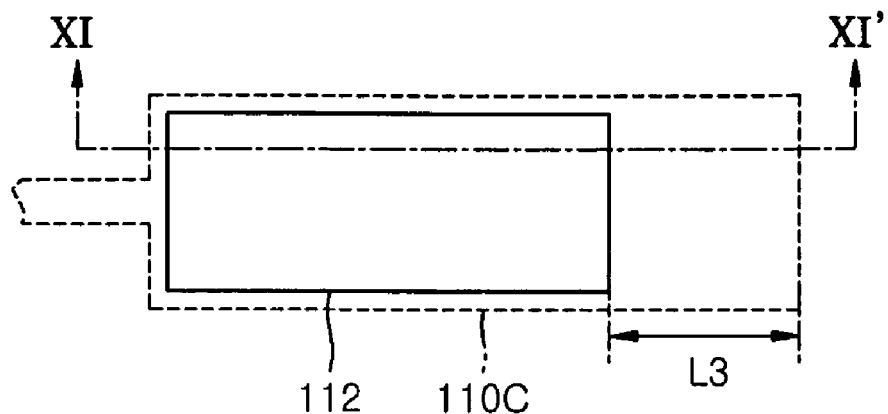
Figure 11:
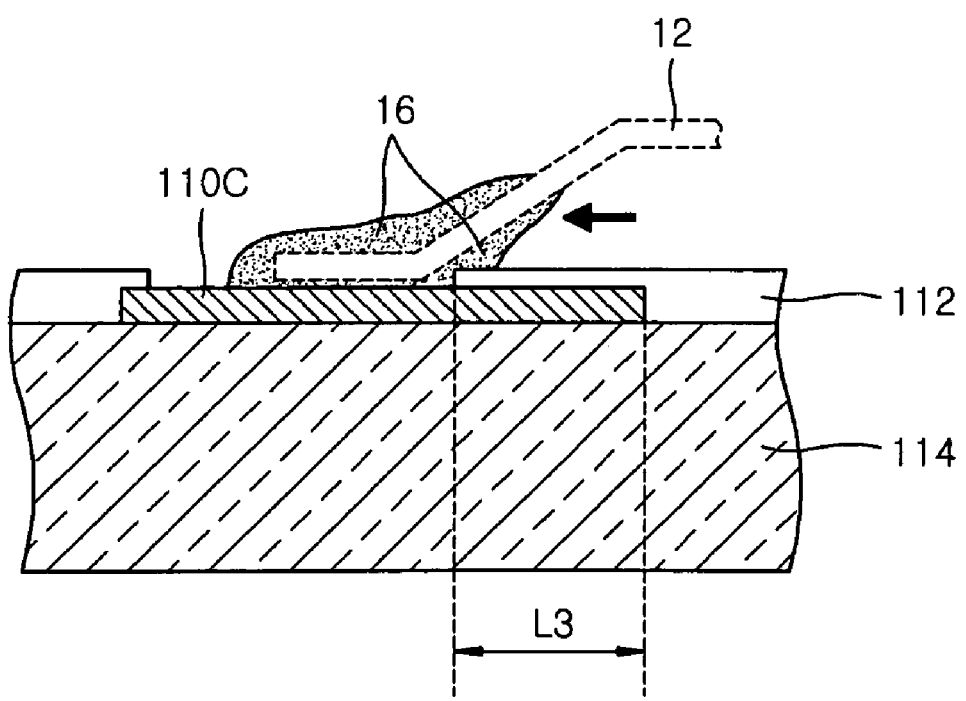

FIG. 10 is a diagram of a pad region illustrating a solder moving portion according to other example embodiments, and FIG. 11 is a diagram illustrating a section taken along a XI-XI' line of FIG. 10. Referring to FIGS. 10 and 11, a solder moving portion L3 according to example embodiments may be a solder resist L3 that may be additionally coated on a portion of a pad 110C to which the shoulder portion of the semiconductor package lead is connected. The solder resist 112 may be formed to entirely expose the pad 110C. The solder resist L3, which is the solder moving portion according to example embodiments, may cover about 10% to about 50% of the total length of the pad 110C. In surface-mounting a semiconductor package on a printed circuit board, an adhesion solder 16 may be coated to a size identical to the length of the original pad 110C in a screen printing manner.

In example embodiments, because the adhesion solder 16 may not adhere to the solder resist in the solder 16 moving portion L3, the adhesion solder 16 may flow in a direction indicated by an arrow of FIG. 11, towards the shoulder portion of the semiconductor package lead 12. The solder 16 flow may remove whisker defects from the shoulder portion of the semiconductor package lead 12. According to other example embodiments, the pad 110C may be surface-treated to have the first and second treated surface portions as in example embodiments described above, which increases an amount of the adhesion solder 16 that flows to the shoulder portion of the semiconductor package lead.

FIG. 12 is a flow chart illustrating example embodiments of a method for mounting a semiconductor package using a printed circuit board, which is capable of removing whisker defects in a semiconductor package according to example embodiments. Referring to FIG. 12, according to a method for mounting a semiconductor package using a printed circuit board, capable of removing whisker defects of a semiconductor package according to example embodiments, a printed circuit board may be provided on which a semiconductor package having leads may be mounted and which may include an insulating substrate, pads and a solder resist (S100). The printed circuit board may have a solder moving portion. The solder moving portion may have one of the shapes similar to the embodiments in FIGS. 5, 8 and 10 and/or a combination thereof.

The pad of the printed circuit board may be coated with an adhesion solder (S110). Various methods or processes may be used to coat the pad with the adhesion solder, for example, a screen printing process may be used. A semiconductor package having leads may be positioned and mounted on the pad region of the printed circuit board, which may be coated with the adhesion solder (S120). The leads of the semiconductor package may be gull wing leads, and the semiconductor package may be one of SOP, QFP, TSOP and/or TQFP.

Positioning the semiconductor package at a designated position on the printed circuit board may be performed by a surface mounting equipment robot. The printed circuit board, on which the semiconductor package is positioned, may be put into an IR reflow oven. The semiconductor package may be adhered to a predetermined or given portion of the printed circuit board while passing through the high-temperature IR reflow oven. The whisker defects on the semiconductor package lead may be removed using the solder moving portion by enabling the adhesion solder to move to the shoulder portion of the semiconductor package lead on the pad of the printed circuit board (S130).

According to example embodiments described above, the adhesion solder may ride on the shoulder portion of the semiconductor package lead through the modified surface treatment of the pads of the printed circuit board or the modified design of the pad region of the printed circuit board. It may be possible to dissolve and remove whisker defects on the shoulder portion of the semiconductor package lead in mounting the semiconductor package on the printed circuit board.

While example embodiments have been particularly shown and described with reference to example embodiments thereof, it will be understood by those of ordinary skill in the art that various changes in form and details may be made therein without departing from the spirit and scope of the following claims.

What is claimed is:

1. A printed circuit board, comprising:
    an insulating substrate for a printed circuit board on which a semiconductor package having leads is mounted;
    pads on a surface of the insulating substrate and to which the leads of the semiconductor package are connected; and
    a solder resist covering the insulating substrate and including openings in the solder resist exposing at least a portion of the pads to which the leads of the semiconductor package are connected,
    wherein the pads include a solder moving portion for allowing an adhesion solder coated on each pad to move to a shoulder portion of the semiconductor package lead when the semiconductor package lead is connected to the pad,
    the solder moving portion includes:
        a first treated surface portion formed by surface treating one end of the pad, to which one end of the semiconductor package lead is connected, with a water-soluble oxidization inhibiting material; and
        a second treated surface portion formed by surface treating a portion of the pad, to which the lead shoulder portion opposite to the end of the semiconductor package lead is connected, with a plating metal.

2. The printed circuit board of claim 1, wherein the semiconductor package leads are gull wing leads.

3. The printed circuit board of claim 1, wherein the semiconductor package is one of a small outline package, a thin small outline package, a quad flat package, and a thin quad flat package.

4. The printed circuit board of claim 1, wherein the pad is a raised printed circuit pattern.

5. The printed circuit board of claim 1, wherein the pad is a sunken printed circuit pattern.

6. The printed circuit board of claim 1, wherein the printed circuit board is a printed circuit board for a semiconductor package module.

7. The printed circuit board of claim 1, wherein the plating metal for the second treated surface portion is a metal including at least one of copper, nickel and gold (Au).

8. The printed circuit board of claim 1, wherein the water-soluble oxidization inhibiting material on the first treated surface portion is an Organic Solderability Preservative (OSP).

9. The printed circuit board of claim 1, wherein the first treated surface portion has a length ranging from about 30% to about 70% of the total length of the pad.

10. The printed circuit board of claim 1, wherein the solder moving portion is a solder resist that is additionally coated on a portion of the pad to which the shoulder portion of the semiconductor package lead is connected.

11. The printed circuit board of claim 10, wherein the solder resist that is additionally coated on a portion of the pad to which the shoulder portion of the semiconductor package lead is connected has a length ranging from about 10% to about 50% of a total length of the pad.

12. The printed circuit board of claim 10, wherein the pad includes:
- a first treated surface portion formed by surface treating one end of the pad, to which one portion of the semiconductor package lead is connected, with a water-soluble oxidization inhibiting material; and
- a second treated surface portion formed by surface treating a portion of the pad, to which the lead shoulder portion opposite to the end of the semiconductor package lead is connected, with a plating metal.

13. A printed circuit board, comprising:
- an insulating substrate for a printed circuit board on which a semiconductor package having leads is mounted;
- pads on a surface of the insulating substrate and to which the leads of the semiconductor package are connected; and
- a solder resist covering the insulating substrate and including openings in the solder resist exposing at least a portion of the pads to which the leads of the semiconductor package are connected,
- wherein the solder moving portion is a portion of the insulating substrate that is not covered by either the pad or the solder resist, and is adjacent to a portion of the pad to which the shoulder portion of the semiconductor package lead is connected, and
- wherein the pads include a solder moving portion for allowing an adhesion solder coated on each pad to move to a shoulder portion of the semiconductor package lead when the semiconductor package lead is connected to the pad,
- the pad includes:
  - a first treated surface portion formed by surface treating one portion of the pad, to which one end of the semiconductor package lead is connected, with a water-soluble oxidization inhibiting material; and
  - a second treated surface portion formed by surface treating a portion of the pad, to which the lead shoulder portion opposite to the end of the semiconductor package lead is connected, with a plating metal.

14. The printed circuit board of claim 13, wherein the portion of the insulating substrate, that is covered by neither the pad nor the solder resist, has a length ranging from about 10% to about 50% of the total length of the pad.

15. A printed circuit board, comprising:
- an insulating substrate for a printed circuit board on which a semiconductor package having leads is mounted;
- pads on a surface of the insulating substrate and to which the leads of the semiconductor package are connected; and
- a solder resist covering the insulating substrate and including openings in the solder resist exposing at least a portion of the pads to which the leads of the semiconductor package are connected,
- wherein the pads include a solder moving portion for allowing an adhesion solder coated on each pad to move to a shoulder portion of the semiconductor package lead when the semiconductor package lead is connected to the pad,
- wherein the solder moving portion is a solder resist that is additionally coated on a portion of the pad to which the shoulder portion of the semiconductor package lead is connected,
- the pad includes:
  - a first treated surface portion formed by surface treating one end of the pad, to which one portion of the semiconductor package lead is connected, with a water-soluble oxidization inhibiting material; and
  - a second treated surface portion formed by surface treating a portion of the pad, to which the lead shoulder portion opposite to the end of the semiconductor package lead is connected, with a plating metal.

16. The printed circuit board of claim 15, wherein the solder resist that is additionally coated on a portion of the pad to which the shoulder portion of the semiconductor package lead is connected has a length ranging from about 10% to about 50% of a total length of the pad.

* * * * *